United States Patent

Young et al.

(10) Patent No.: US 6,514,672 B2
(45) Date of Patent: Feb. 4, 2003

(54) DRY DEVELOPMENT PROCESS FOR A BI-LAYER RESIST SYSTEM

(75) Inventors: Bao-Ju Young, I-Lan (TW); Chia-Shiung Tsai, Hsin-Chu (TW); Ying-Ying Wang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 82 days.

(21) Appl. No.: 09/877,325

(22) Filed: Jun. 11, 2001

(65) Prior Publication Data

US 2001/0046632 A1 Nov. 29, 2001

Related U.S. Application Data

(62) Division of application No. 09/334,904, filed on Jun. 17, 1999, now Pat. No. 6,255,022.

(51) Int. Cl.[7] ............................................... G03C 5/00
(52) U.S. Cl. ...................... 430/314; 430/312; 430/316; 430/317; 430/318; 430/329; 430/330
(58) Field of Search ........................... 430/5, 312, 313, 430/315, 330, 30, 270.1, 314, 327, 329, 316, 317, 318; 216/47, 58, 67

(56) References Cited

U.S. PATENT DOCUMENTS

| 4,882,008 A | | 11/1989 | Garza et al. ............... 156/643 |
|---|---|---|---|
| 5,286,607 A | | 2/1994 | Brown ....................... 430/313 |
| 5,318,877 A | * | 6/1994 | Ober et al. ................. 430/270 |
| 5,545,512 A | | 8/1996 | Nakato ....................... 430/323 |
| 5,756,256 A | * | 5/1998 | Nakato et al. ............. 430/272.1 |
| 5,935,762 A | * | 8/1999 | Dai et al. ................... 430/312 |
| 6,045,981 A | * | 4/2000 | Matsunaga et al. ......... 430/330 |
| 6,074,568 A | * | 6/2000 | Adachi et al. ................ 216/59 |
| 6,255,022 B1 | * | 7/2001 | Young et al. .................. 430/5 |

* cited by examiner

Primary Examiner—Mark F. Huff
Assistant Examiner—Saleha R. Mohamedulla
(74) Attorney, Agent, or Firm—George O. Saile; Stephen B. Ackerman; Rosemary L. S. Pike

(57) ABSTRACT

A new method of forming a bi-layer photoresist mask with a reduced critical dimension bias between isolated and dense lines and reduced edge roughness is described. A layer to be etched is provided on a semiconductor substrate wherein the surface of the layer has an uneven topography. The layer to be etched is coated with a first planarized photoresist layer which is baked. The first photoresist layer is coated with a second silicon-containing photoresist layer which is baked. Portions of the second photoresist layer not covered by a mask are exposed to actinic light. The exposed portions of the second photoresist layer are developed away. Then, portions of the first photoresist layer not covered by the second photoresist layer remaining are developed away in a dry development step wherein sufficient $SO_2$ gas is included in the developing recipe to reduce microloading to form a bi-layer photoresist mask comprising the first and second photoresist layers remaining. Thereafter, the bi-layer photoresist mask is ashed to smooth its sidewall edges. This completes formation of a bi-layer photoresist mask having a reduced critical dimension bias between isolated and dense lines and reduced edge roughness.

13 Claims, 4 Drawing Sheets

DRY DEVELOPMENT PROCESS FOR A BI-LAYER RESIST SYSTEM

This is a division of patent application Ser. No. 09/334,904, filing date Jun. 17, 1999 now U.S. Pat No. 6,255,022. A Novel Dry Development Process For A Bi-Layer Resist System, assigned to the same assignee as the present invention.

BACKGROUND OF THE INVENTION (1) Field of the Invention

The invention relates to a method of fabricating a photoresist mask, and more particularly, to a method of fabricating a bi-layer photoresist mask that will improve critical dimension control in the manufacture of integrated circuits.

(2) Description of the Prior Art

Device sizes continue to shrink as semiconductor manufacturing processes are improved. Continuing advancement in the production of ever smaller devices is limited by photolithography techniques. Dry development processes can increase the overall process window for micro-patterning techniques. Dry development processes can improve resolution and depth of focus and result in more vertical resist profiles. However, the critical dimension bias between isolated and dense lines is too large. That is, because of microloading, isolated lines etch faster than dense lines resulting in an unacceptable difference in critical dimension. Also, after dry development in the bi-layer resist process, the resist line edge is very rough. This will cause imprecision in etching.

U.S. Pat. No. 5,545,512 to Nakato and U.S. Pat. No. 5,286,607 to Brown teach a bi-layer resist process in which a silylated layer is formed between the bi-layers. $O_2$ dry development is used. U.S. Pat. No. 4,882,008 to Garza et al disclose a silylation process and $O_2$ dry development of the resist using NO as the oxygen source.

SUMMARY OF THE INVENTION

A principal object of the present invention is to provide an effective and very manufacturable method of providing improved critical dimension control in photolithography.

Another object of the present invention is to provide a method of fabricating a photoresist mask with improved critical dimension control.

A further object of the present invention is to provide a method of fabricating a bi-layer photoresist mask with improved critical dimension control.

A still further object of the invention is to provide a method of fabricating a bi-layer photoresist mask with a reduced critical dimension bias between isolated and dense lines.

Yet another object of the invention is to provide a method of fabricating a bi-layer photoresist mask with a reduced critical dimension bias between isolated and dense lines by using a high $SO_2$ gas dry development process.

Yet another object is to reduce edge roughness of a bi-layer photoresist mask after dry development.

A still further object of the invention is to reduce edge roughness of a bi-layer photoresist mask after dry development by adding an ashing step.

Yet another object of the invention is to provide a method of fabricating a bi-layer photoresist mask with a reduced critical dimension bias between isolated and dense lines and reduced edge roughness.

In accordance with the objects of this invention a new method of forming a bi-layer photoresist mask with a reduced critical dimension bias between isolated and dense lines and reduced edge roughness is achieved. A layer to be etched is provided on a semiconductor substrate wherein the surface of the layer has an uneven topography. The layer to be etched is coated with a first planarized photoresist layer which is baked. The first photoresist layer is coated with a second silicon-containing photoresist layer which is baked. Portions of the second photoresist layer not covered by a mask are exposed to actinic light. The exposed portions of the second photoresist layer are developed away. Then, portions of the first photoresist layer not covered by the second photoresist layer remaining are developed away in a dry development step wherein sufficient $SO_2$ gas is included in the developing recipe to reduce microloading to form a bi-layer photoresist mask comprising the first and second photoresist layers remaining. Thereafter, the bi-layer photoresist mask is ashed to smooth its sidewall edges. This completes formation of a bi-layer photoresist mask having a reduced critical dimension bias between isolated and dense lines and reduced edge roughness.

BRIEF DESCRIPTION OF THE DRAWINGS

In the accompanying drawings forming a material part of this description, there is shown.

DESCRIPTION OF THE PREFERRED EMBODIMENTS

Referring to FIGS. 1–8, fabrication and use of a photoresist mask for etching polysilicon gate electrodes will be illustrated and discussed. However, it will be appreciated by those skilled in the art that the process of the present invention can be used in any other photolithography applications as well, such as in local oxidation of silicon (LOCOS) or shallow trench isolation (STI), and other applications.

Figure 1:
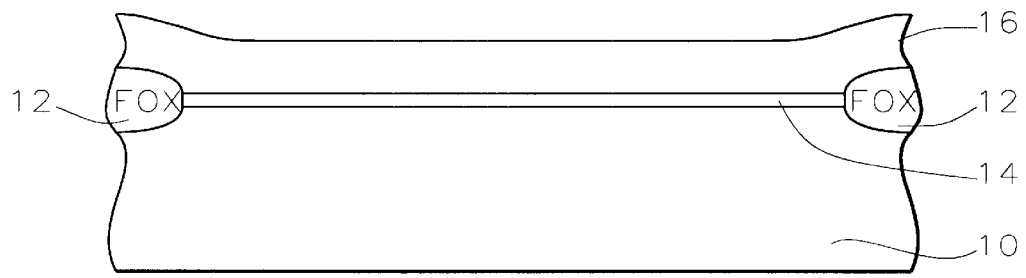
FIGS. 1 through 7 schematically illustrate in cross-sectional representation a preferred embodiment of the present invention.

Referring now more particularly to FIG. 1, a portion of a partially completed integrated circuit device is illustrated. A semiconductor substrate 10 is shown, preferably composed of monocrystalline silicon. Field oxide regions 12 have been formed as is conventional in the art in the semiconductor substrate 10 resulting in an uneven topography of the surface of the substrate.

A layer of gate silicon oxide 14 is grown over the surface of the semiconductor substrate. A layer 16 of polysilicon or polycide is deposited over the uneven surface of the substrate to a thickness of, for example, between about 2000 and 3000 Angstroms.

Figure 2:
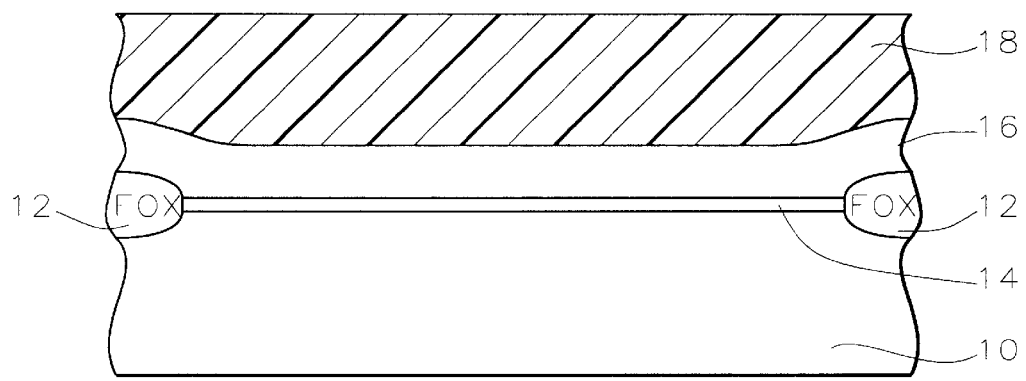

Referring now to FIG. 2, a first underlayer of photoresist 18 is coated onto the polysilicon layer 16 to a thickness of between about 4000 and 5000 Angstroms. This photoresist layer is thick enough to be planarized at its top surface. The photoresist layer 18 may be an acrylic polymer, for example. The photoresist underlayer 18 is baked at a temperature of between about 120 and 130° C. for a duration of between about 2 and 3 minutes.

Figure 3:
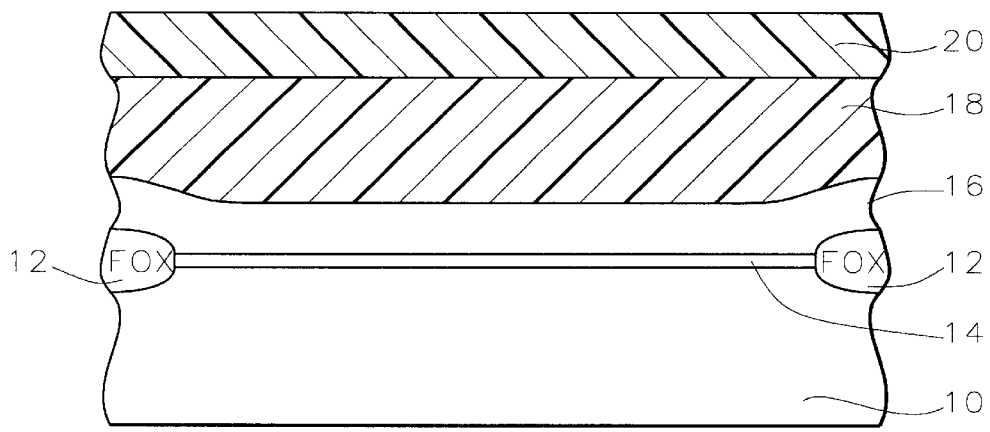

Referring now to FIG. 3, the second photoresist layer 20 is coated overlying the first photoresist underlayer 18. Photoresist layer 20 may be a methacrylate ter-polymer or a silicon-containing monomer, for example, having a thickness in the range of 2000 to 3000 Angstroms. The second photoresist 20 is baked at a temperature of between about 120 and 130° C. for a duration of between about 2 and 3 minutes. If the second photoresist layer does not contain silicon as deposited, the second photoresist layer is silylated. Silylation will make the exposed portion of the photoresist layer resistant to dry etchants, such as $O_2$ reactive ion etching (RIE). During silylation, the photoresist is heated in an atmosphere containing a silylation agent. Typical silylation agents include N,N Diethylamino-trimethylsilane (TMSDEA), 1,1,3,3-Tetramethyldisilazane (TMDS), Trimethylsilyldimethylamine (TMSDMA), Dimethylsilyldiethylamine (DMSDEA), and Dimethylsilyldimethylamine (DMSDMA). The hydrogen-containing radicals in the exposed portion of the photoresist 20 are displaced by silicon atoms in the silylating agent to form silylated layer 20.

Figure 4:
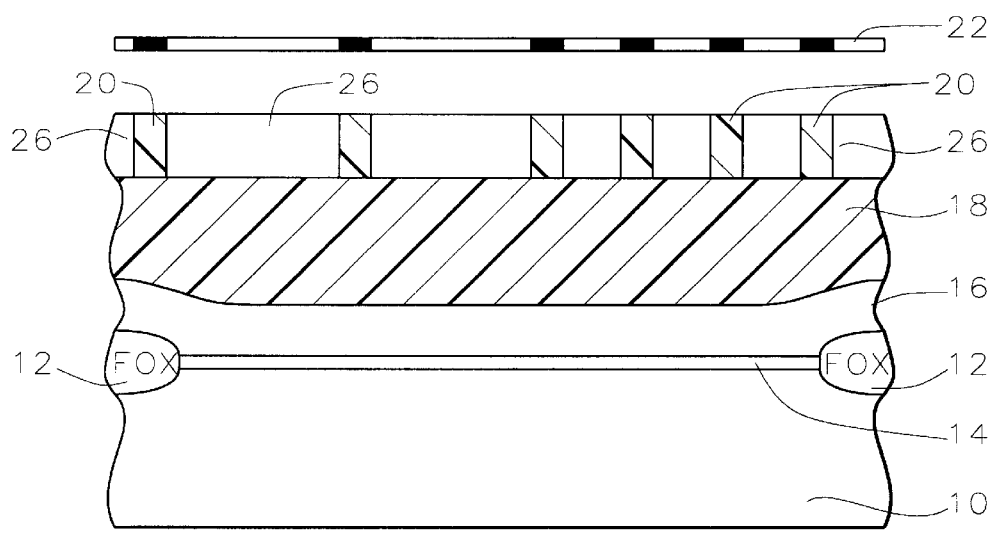

Referring now to FIG. 4, the photoresist layer 20 is exposed to actinic light through a mask 22. The portions 26 not blocked by the mask 22 are exposed.

Figure 5:
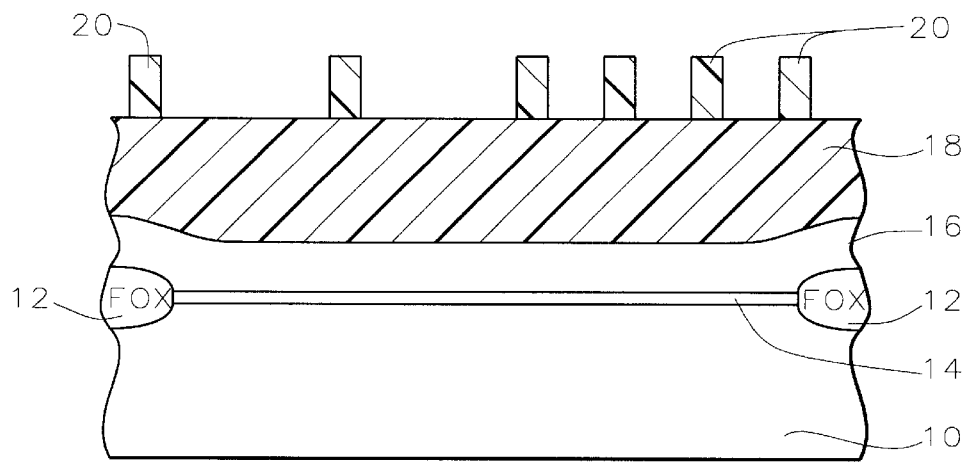

Referring now to FIG. 5, the exposed portions of the photoresist 26 are developed away using a conventional developer leaving the unexposed portions 20 of the photoresist as a photomask.

Figure 6:
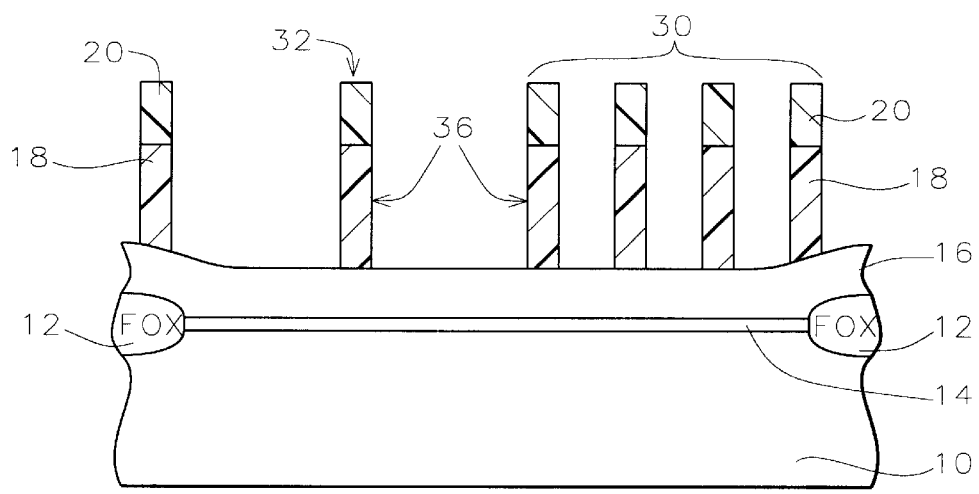

Next, referring to FIG. 6, an oxygen dry etching is used to remove the photoresist underlayer 18 not covered by the photomask. The silicon-containing photoresist layer 20 blocks the dry etchant so that the underlying resist remains.

In the prior art, this etching may be done using $O_2/SO_2$, where $O_2$ is flowed at about 40 sccm and $SO_2$ is flowed at about 10 sccm. However, in the process of the present invention, a new dry $O_2$ development recipe is used. $SO_2$ is a passivating gas. It is desired that the $SO_2$ passivate the resist sidewalls in order to reduce the microloading effect especially in the area of dense lines, such as in area 30. Thus, the process of the present invention increases the $SO_2$ gas content of the development recipe. This adjusts the concentration of the $O_2$ gas, passivates the resist sidewalls, and hence reduces microloading. The result is that the critical dimension bias between the dense lines 30 and the isolated lines 32 will be minimized.

The $O_2$ dry development recipe of the present invention comprises flowing $O_2$ at 30 to 40 sccm and preferably about 40 sccm, flowing He at 50 to 60 sccm and preferably about 50 sccm, and flowing $SO_2$ at 60 to 70 sccm and preferably about 60 sccm. A pressure of between about 5 and 6 mTorr is maintained and a power of 400 to 500 watts is applied. That is, the top power is about 450 watts and the bottom power is about 120 watts.

After dry development, the remaining top resist layer 20 has been changed to silicon dioxide and the bi-layer photomask 18/20 is complete.

An unwanted side effect of the dry development of the silicon-containing photoresist layer 20 is roughened edges of the resist lines at 36. This roughness can be seen by scanning electron microscope (SEM). The process of the present invention improves this edge roughness by applying an ashing step after dry development of the resist underlayer.

The ashing step of the present invention comprises flowing HBr at 30 to 40 sccm and flowing $O_2$ at 10 to 20 sccm under a pressure of 5 to 6 mTorr and top power of 270 to 280 watts and 120 to 130 watts bottom power for 10 to 15 seconds. This is a conventional ashing recipe, but it is not conventional to use ashing at this point. Ashing is normally used to remove a photoresist mask. Photomask 20 will not be removed by the ashing step because it has been changed to silicon dioxide. The ashing does remove the sidewall surface roughness of the edges of the resist lines.

After the ashing step of the invention, it can be seen by SEM that the edges 36 of the resist lines are smooth.

Figure 7:
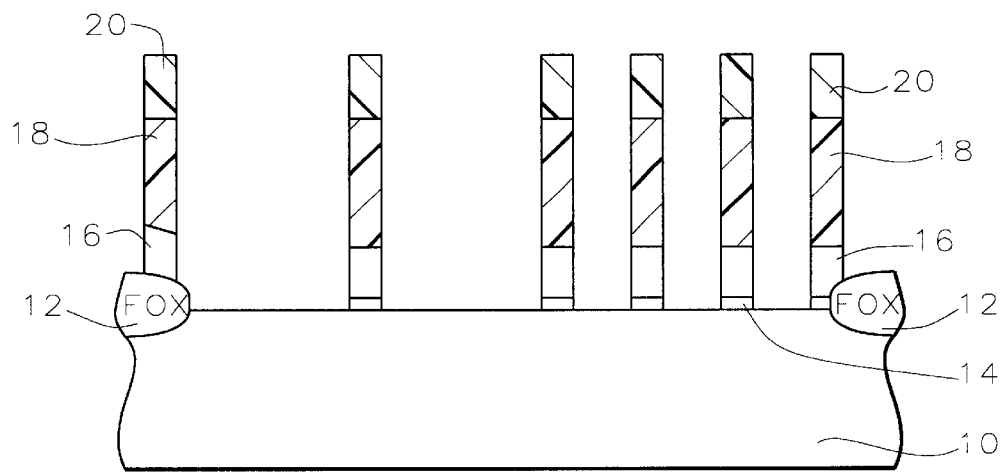

Now the bi-layer photoresist mask 18/20 is ready to be used in etching t he underlying layer 16. For example, as shown in FIG. 7, the layers 16 and 14 are etched away where they are not covered by the photomask 18/20 to form polysilicon or polycide gates and lines 16.

Figure 8:
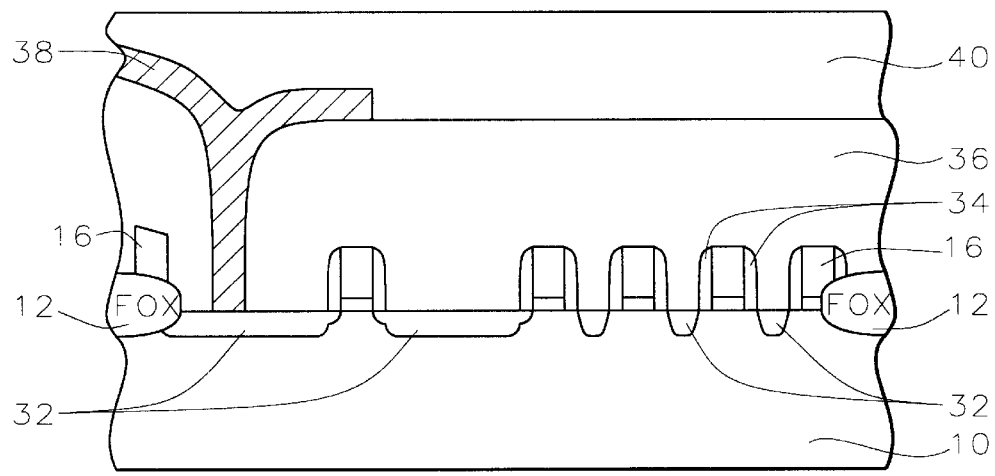
FIG. 8 schematically illustrates in cross-sectional representation a completed integrated circuit device fabricated by the process of the present invention.

The bi-layer photoresist mask 18/20 is removed. Processing continues as is conventional in the art. For example, as shown in FIG. 8, source and drain regions may be formed in the semiconductor substrate, such as N+ regions 32. Silicon oxide spacers 34 may be formed on the sidewalls of the gate electrodes 16. The semiconductor device structures may be covered by a thick dielectric layer 36. Openings are made through the dielectric layer 36 to underlying semiconductor structures such as source/drain region 32. A conducting layer may be deposited and patterned to complete electrical connections 38 to the underlying device structures. A passivation layer 40 completes the device.

The process of the present invention results in a uniform circuit critical dimension. The bi-layer photoresist mask of the invention allows for an increased process window for micro-patterning techniques without a critical dimension bias due to microloading. Line edge performance of the photoresist mask is improved by the ashing process of the present invention.

While the invention has been particularly shown and described with reference to the preferred embodiments thereof, it will be understood by those skilled in the art that various changes in form and details may be made without departing from the spirit and scope of the invention.

What is claimed is:

1. A method of providing a uniform critical dimension during photoetching in the fabrication of an integrated circuit comprising:

providing a layer to be etched on a semiconductor substrate wherein the surface of said layer has an uneven topography;

coating said layer to be etched with a first photoresist layer wherein said first photoresist layer is planarized;

baking said first photoresist layer;

coating said first photoresist layer with a second silicon-containing photoresist layer;

baking said second photoresist layer;

exposing portions of said second photoresist layer not covered by a mask to actinic light;

first developing away said exposed portions of said second photoresist layer;

second developing away portions of said first photoresist layer not covered by said second photoresist layer remaining wherein sufficient $SO_2$ gas is included in said second developing to reduce microloading to form a bi-layer photoresist mask comprising said first and second photoresist layers remaining;

thereafter ashing said bi-layer photoresist mask to smooth the sidewall edges of said bi-layer photoresist mask;

thereafter etching away said layer to be etched where it is not covered by said bi-layer photoresist mask; and removing said bi-layer photoresist mask to complete said photoetching having said uniform critical dimension in the fabrication of said integrated circuit.

2. The method according to claim 1 wherein said first photoresist layer comprises an acrylic polymer and is coated to a thickness of between about 4000 and 5000 Angstroms.

3. The method according to claim 1 wherein said first photoresist layer is baked at a temperature of between about 120 and 130° C. for 2 to 3 minutes.

4. The method according to claim 1 wherein said second photoresist layer comprises a silicon-containing monomer and is coated to a thickness of between about 2000 and 3000 Angstroms.

5. The method according to claim 1 wherein said second photoresist layer is baked at a temperature of between about 120 and 130° C. for 2 to 3 minutes.

6. The method according to claim 1 wherein said step of second developing away comprises flowing $O_2$ gas at between about 30 and 40 sccm, flowing He at between about 50 and 60 sccm, and flowing $SO_2$ at between about 60 and 70 sccm at a pressure of 5 to 6 mTorr and top power of 400 to 500 watts and bottom power of 120 to 130 watts.

7. The method according to claim 1 wherein said step of ashing comprises flowing HBr gas at between about 30 and 40 sccm and flowing $O_2$ gas at between about 10 and 20 sccm at a pressure of 5 to 6 mTorr and top power of 270 to 210 watts and bottom power of 120 to 130 watts.

8. A method of providing a uniform critical dimension during photoetching in the fabrication of an integrated circuit comprising:

providing a layer to be etched on a semiconductor substrate wherein the surface of said layer has an uneven topography;

coating said layer to be etched with a first photoresist layer wherein said first photoresist layer is planarized;

baking said first photoresist layer;

coating said first photoresist layer with a second photoresist layer and silylating said second photoresist layer to form a silicon-containing photoresist layer;

baking said silicon-containing photoresist layer;

exposing portions of said silicon-containing photoresist layer not covered by a mask to actinic light;

first developing away said exposed portions of said silicon-containing photoresist layer;

second developing away portions of said first photoresist layer not covered by said silicon-containing photoresist layer remaining wherein sufficient $SO_2$ gas is flowed at between about 60 and 70 sccm in said second developing to reduce microloading to form a bi-layer photoresist mask comprising said first and second silicon-containing photoresist layers remaining;

thereafter ashing said bi-layer photoresist mask to smooth the sidewall edges of said bi-layer photoresist mask;

thereafter etching away said layer to be etched where it is not covered by said bi-layer photoresist mask; and removing said bi-layer photoresist mask to complete said photoetching having said uniform critical dimension in the fabrication of said integrated circuit.

9. The method according to claim 8 wherein said first photoresist layer comprises an acrylic polymer and is coated to a thickness of between about 4000 and 5000 Angstroms.

10. The method according to claim 8 wherein said first photoresist layer is baked at a temperature of between about 120 and 130° C. for 2 to 3 minutes.

11. The method according to claim 8 wherein said second photoresist layer comprises a silicon-containing monomer and is coated to a thickness of between about 2000 and 3000 Angstroms.

12. The method according to claim 8 wherein said step of second developing away comprises flowing $O_2$ gas at between about 30 and 40 sccm, flowing He at between about 50 and 60 sccm, and flowing $SO_2$ at between about 60 and 70 sccm at a pressure of 5 to 6 mTorr and top power of 400 to 500 watts and bottom power of 120 to 130 watts.

13. The method according to claim 8 wherein said step of ashing comprises flowing HBr gas at between about 30 and 40 sccm and flowing $O_2$ gas at between about 10 and 20 sccm at a pressure of 5 to 6 mTorr and top power of 270 to 280 watts and bottom power of 120 to 130 watts.

* * * * *